United States Patent [19]

Parker

[11] Patent Number: 4,715,065
[45] Date of Patent: Dec. 22, 1987

[54] APPARATUS FOR DISTINGUISHING BETWEEN SPEECH AND CERTAIN OTHER SIGNALS

[75] Inventor: John P. Parker, Crawley, United Kingdom

[73] Assignee: U.S. Philips Corporation, New York, N.Y.

[21] Appl. No.: 601,839

[22] Filed: Apr. 19, 1984

[30] Foreign Application Priority Data

Apr. 20, 1983 [GB] United Kingdom ................. 8310708

[51] Int. Cl.[4] .............................................. G10L 3/00
[52] U.S. Cl. ........................................................ 381/46
[58] Field of Search ........................................... 381/46

[56] References Cited

U.S. PATENT DOCUMENTS 4,401,849 8/1983 Ichikawa et al. ..................... 381/46

OTHER PUBLICATIONS

Rabiuer/Schafer, "Digital Processing of Speech Signals", Prentice Hall 1978, pp. 141–149.

Primary Examiner—Gareth D. Shaw
Assistant Examiner—Christina M. Eakman
Attorney, Agent, or Firm—Thomas A. Briody; Jack E. Haken; Anne E. Barschall

[57] ABSTRACT

Apparatus for distinguishing betwen speech and, for example, data and noise signals, for example for use in a non-speech squelch circuit in a broadcast receiver, utilises the fact that an autocorrelogram of a speech signal exhibits peaks which wander backwards and forwards along the delay axis, this not being the case for autocorrelograms of most other signals. Autocorrelograms of an input signal applied to an input terminal (1) and hard-limited by means of a comparator (5) are formed under the control of a computer (14) by means of a shift register (3), a multiplexer (10) an inverting EXOR-gate (7), an up/down counter (19) and a memory (41). For each clock pulse fed to the clock input (30) of the shift register the output (11) of the multiplexer, and hence one input of the EXOR-gate, is switched to each of a succession of taps (8) on the shift register. Thus the signal on the first tap (6) of the register is multiplied in succession by the signals on the other taps (8) and the results are used to increment or decrement corresponding quantities in the memory (41) by means of the up/down counter (19). Autocorrelograms relating to successive periods of time are formed in this way and the computer determines the positions of the peaks (if any) in each and by comparison of these positions determines whether they are stationary or wandering.

16 Claims, 11 Drawing Figures

APPARATUS FOR DISTINGUISHING BETWEEN SPEECH AND CERTAIN OTHER SIGNALS

BACKGROUND OF THE INVENTION

This invention relates to apparatus for distinguishing between speech and certain other signals.

There are several situations in the communications field where it would be advantageous if a speech signal could be distinguished from other signals in an automatic and reasonably reliable manner. For example, in addition to speech and noise the HF communications frequency band accommodates Morse-coded messages and also data traffic which may take several different forms, and it is highly desirable in, for example, a communications centre or monitoring station where the only transmissions of interest are speech that the audio output of a communications receiver be automatically disabled when no speech is actually being received and be automatically enabled otherwise, thereby preventing data traffic, Morse-coded messages, noise etc. from reaching the ear of an operator but allowing speech through. This is particularly important where the operator has to listen to several radios at once. The provision of such a facility could also result in a reduction in the average power consumption of the receiver, which would be of obvious importance if the receiver were battery-powered. Another potential use of such a facility is in an automatic rebroadcast station where, ideally, the transmitter should be switched on only when a wanted (speech) signal is received.

The automatic disabling of the audio channel of a receiver in the absence of a wanted signal is often referred to as "squelch" and it is common practice, for example, to provide such a facility in VHF FM broadcast receivers to mute the audio channel in the absence of a received carrier of a predetermined amplitude, thereby inter alia preventing noise from reaching a listener when the receiver is tuned from one broadcast programme to another. Threshold-responsive carrier-operated squelch is very reliable in an FM system but, obviously, such a facility cannot distinguish between the different modulations which may be encountered, for example between speech and data. It is therefore only of limited assistance in environments such as the communication centre or monitoring station referred to above.

SUMMARY OF THE INVENTION

It is an object of the invention to provide means which can enable a squelch facility to differentiate, at least to some extent, between speech signals and certain other forms of signal.

The invention provides apparatus for distinguishing between speech and certain other signals, comprising an input for said signals and means for (a) effectively forming, for each of successive periods of time, a respective autocorrelogram of a signal applied in operation to said input, (b) detecting the presence of peaks in said autocorrelograms or in autocorrelograms derived therefrom, and (c) determining whether peaks so detected are stationary or wandering with respect to the delay axes of the autocorrelograms in which they are detected as these autocorrelograms relate to the successive periods of time. The term "peak" is to be understood to embrace peaks having either sense.

It has now been recognized that, because a voiced speech sound consists of a number of harmonically related components plus some noise, an autocorrelogram thereof contains a number of peaks (positive and negative) the positions of which along the delay axis of the autocorrelogram are determined by the instantaneous frequency of vibration of the vocal chords. In the course of speech this frequency of vibration, i.e. the pitch of the voice, wanders up and down in a non-discontinuous manner (for an individual it may vary approximately 40%), with the result that the peaks and troughs in the autocorrelogram wander along the delay axis thereof in a corresponding manner. Thus, if autocorrelograms are formed of an unknown signal for successive periods of time and it is found that they contain peaks which wander backwards and forwards along the delay axis in a non-discontinuous manner as the autocorrelograms relate to the successive periods of time then, because most other types of signal do not in general give rise to autocorrelograms which exhibit these features, there is a strong indication that the signal is a speech signal. On the other hand, if it is found that the autocorrelograms do not contain peaks, or if they do contain peaks but these do not wander along the delay axis in a non-discontinuous manner, there is a strong indication that the signal is not a speech signal.

Figure 1:
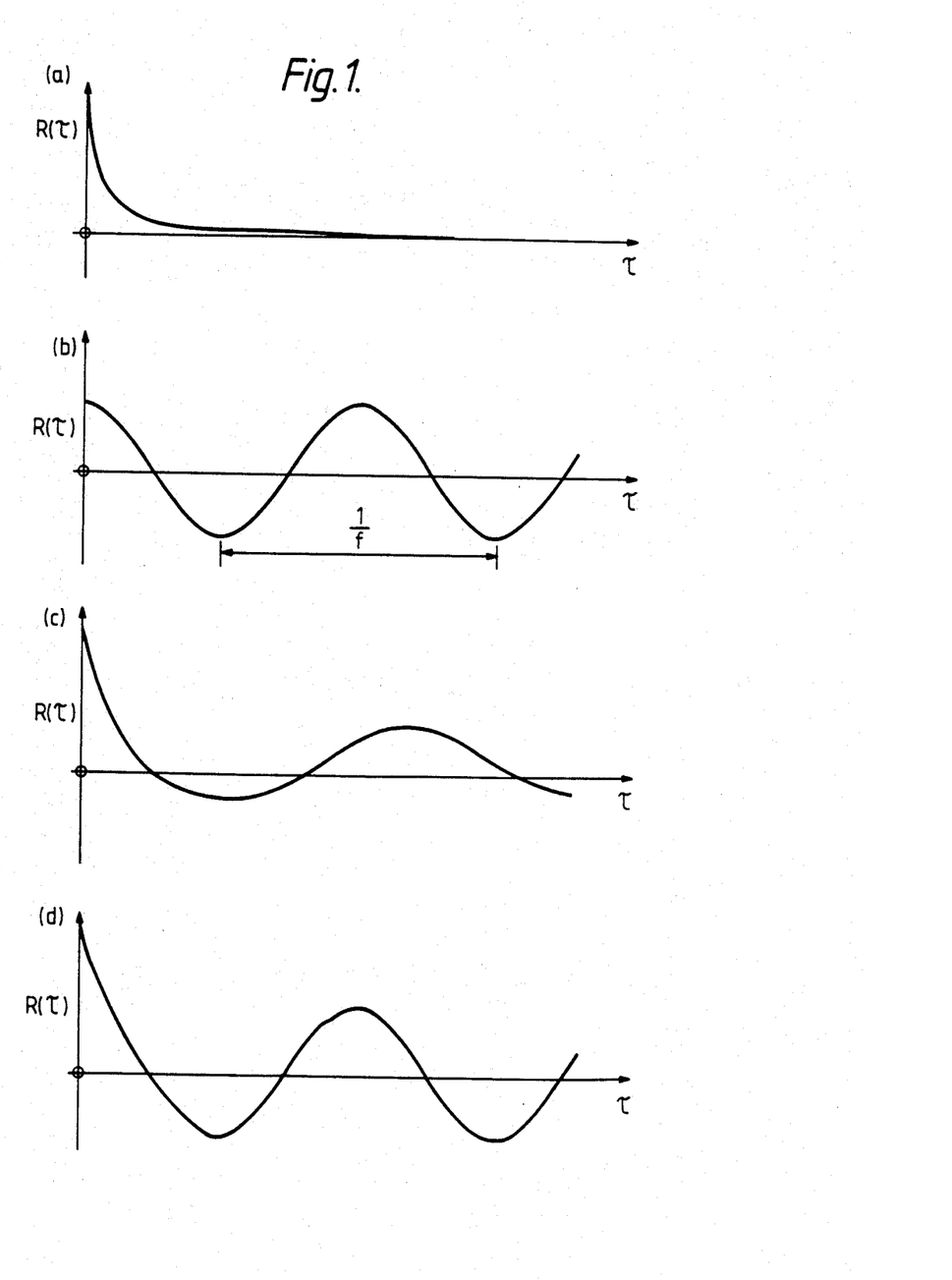
FIGS. 1a, 1b, 1c and 1d show examples of autocorrelograms of various signals, as previously discussed.

Examples of autocorrelograms for various signals are shown in FIG. 1 of the drawings, each autocorrelogram being a plot of the autocorrelation function $R(\tau)$ against the delay $\tau$ between the samples of the corresponding signal from which the corresponding value of the autocorrelation function is derived. In general the autocorrelation function $R(\tau)$ of the signal $v(t)$ is ideally given by:

$$R(\tau) = \frac{1}{T} \int_0^T v(t)v(t - \tau)dt. \qquad (2)$$

$$T \to \infty$$

(Obviously some limit has to be placed on the maximum values of T and $\tau$ employed. In FIG. 1 $\tau$ is approximately 2.5 mS.). The autocorrelograms of FIGS. 1a, 1b, 1c and 1d relate to low pass filtered noise, a sinusoidal signal, speech, and a sinusoidal signal plus noise respectively. It will be noted that the low-$\tau$ portion of FIG. 1c is similar to the corresponding portion of FIG. 1a. This is because speech sounds consist of a number of pitch harmonics plus some noise due to fricative effects. If a succession of autocorrelograms similar to FIG. 1c were formed for a given voice signal, these relating to successive periods of time, it would be found that the peaks would wander backwards and forwards along the $\tau$-axis in a non-discontinuous manner. This is in contrast to what would happen in successive auto-correlograms similar to FIG. 1b or FIG. 1d, where the positions of the peaks would remain the same (provided that the frequency f of the sinusoid remains the same). It is found that data signals also give rise to autocorrelograms which contain peaks. However again these do not normally wander, although particular peaks may periodically disappear and new ones appear at a different value of $\tau$.

It has been found that a speech signal will usually give rise to the autocorrelogram features set forth above, and will in consequence be detached as being a speech signal by apparatus of the kind defined, even if it has been preprocessed. Thus, for example, satisfactory results have been obtained with speech signals which have been pre-emphasised, hard-limited, or differentiated and hard-limited. It is preferable though not essential that they be at base-band.

It has been found that satisfactory results are obtainable if, for the formation of each autocorrelogram in operation (a), said means is arranged to quantize to two levels the successive values which at least one of the two component(s) of the signal which contribute to each calculated point on the corresponding autocorrelation function has during the corresponding said period of time and to calculate the value of the corresponding point from the result. Such quantization can facilitate the subsequent processing of the information contained in the respective autocorrelograms in a digital manner.

A bandpass filter may be included in the signal path from said input to said means. The provision of such a filter can enable signals having frequencies outside the frequency range of speech signals to be prevented from contributing to the or each said component and possibly blocking the desired operation of the apparatus.

A particularly simple form of signal processing is obtainable if, for the formation of each autocorrelogram in operation (a), said means is arranged to calculate the value of the corresponding autocorrelation function for each of a plurality of discrete points along its delay axis, and if said means is arranaged in operations (b), (c) to sum the moduli of these values or of values derived therefrom, with the exception of those values (if any) which correspond to delays of less than a predetermined amount, to compare the result with a threshold and, if the threshold is exceeded, to determine whether the detected peaks are stationary. As will be seen from FIG. 1a the autocorrelation function of noise has a high value at zero delay ($\tau=0$) and decreases rapidly to zero as the delay increases. Because the autocorrelation function of a mixture of signals is the sum of the autocorrelation functions of the signals taken individually, if the said sum exceeds a predetermined threshold this is a good indication that a non-noise signal is present at the input. As the autocorrelograms of all non-noise signals exhibit peaks it will be evident that, if the threshold is exceeded, it is virtually certain that peaks are present in the autocorrelograms. Hence, if no stationary peaks are then found in the autocorrelograms, it is virtually certain that wandering peaks are present, i.e. that a speech signal or similar is present at the input. It is in general simpler to determine directly whether a stationary peak is present than whether a wandering peak is present. Thus, if said discrete points are the same for each autocorrelogram said means may be arranged in operations (b), (c) to form a pair of running variables for each of a plurality of said points by (i) detecting, for each autocorrelogram formed in operation (a) or for each autocorrelogram derived therefrom, and for each value of delay which corresponds to a point of the plurality, whether a positive or negative peak is present in that autocorrelogram and, if a positive peak is detected incrementing the first variable of the relevant pair, if a negative peak is detected incrementing the second variable of the relevant pair, and if neither a positive peak nor a negative peak is detected decrementing both variables of the relevant pair and (ii) imposing maximum and minimum values on each said variable, so that a value of a said variable of greater than a predetermined amount is indicative of the presence of a stationary peak in the autocorrelograms formed in operation (a) or in the autocorrelograms derived therefrom at the corresponding value of delay. However, merely detecting whether a non-noise signal is present and, if it is, whether stationary peaks are present in the autocorrelograms formed in operation (a) may result in a mixture of speech and steady tone signals being determined to be a non-speech signal. If this is a disadvantage it can be mitigated if operations (b), (c) are performed on modified versions of the autocorrelograms effectively formed in operation (a), said means being arranged to maintain a running average of the autocorrelograms effectively formed in operation (a) and to form each said modified version as the difference between the corresponding autocorrelogram effectively formed in operation (a) and the current running average after adjusting their relative amplitude by an amount which is such that there is substantially zero correlation between said difference and the current running average. The contributions of steady tone signals to the autocorrelograms processed in operations (b), (c) can be substantially reduced in this way, enabling the peaks produced by a voice signal (if present) to predominate.

BRIEF DESCRIPTION OF THE DRAWINGS

Embodiments of the invention will now be described, by way of example, with reference to the accompanying diagrammatic drawings in which.

DETAILED DESCRIPTION OF THE PREFERRED EMBODIMENT

Figure 2:
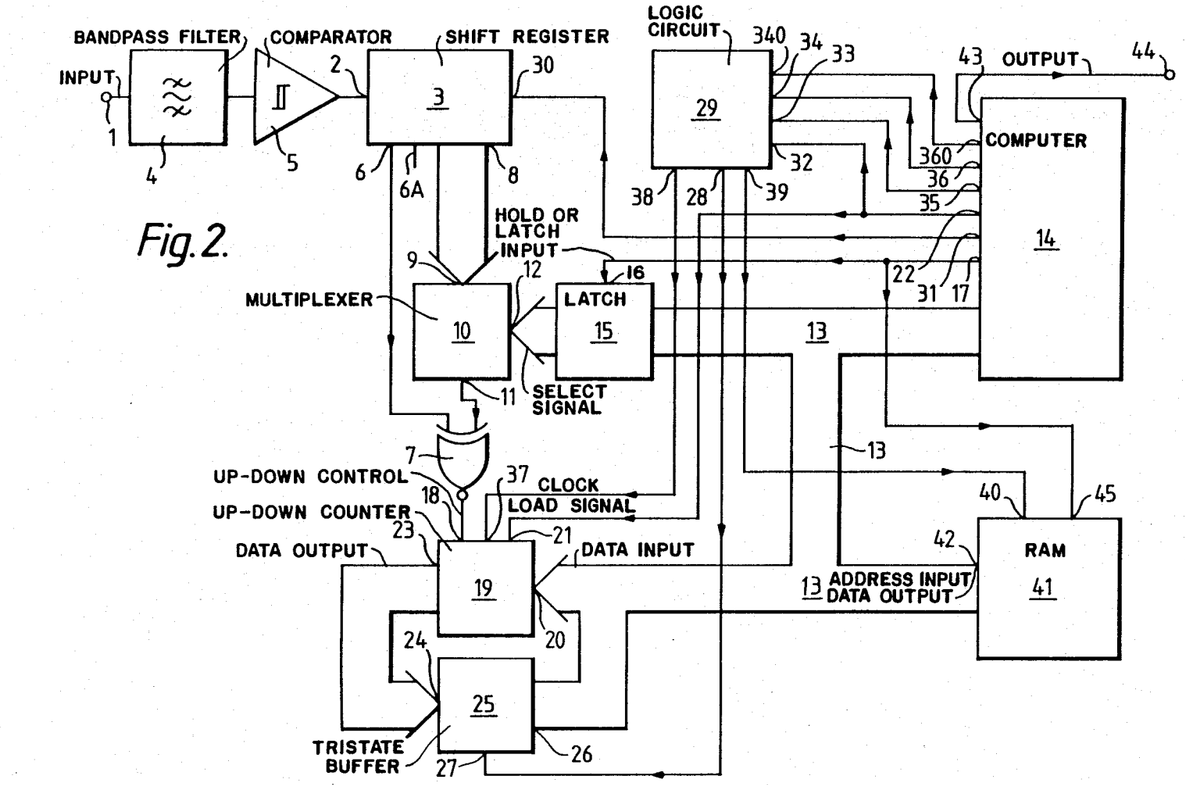
FIG. 2 is a block diagram of a first embodiment.

In FIG. 2 apparatus for distinguishing between speech and certain other signals includes a computer 14 together with various items of hardware most of which is provided to enable certain additional operations to be carried out in the course of what would otherwise be normal memory read operations performed by the computer. More particularly the apparatus has an input 1 for the speech and other signals, this input being coupled to the data input 2 of a shift register 3 via a bandpass filter 4 and a comparator 5. Shift register 3, the shift signal input 30 of which is fed from an output 31 of the computer 14, may have, for example, sixteen stages and the data output 6 of the first of its stages is coupled to one input of an EXCLUSIVE-OR gate 7 provided with an inverting output. The data output 6A of the second stage of register 3 is not connected and data outputs 8 of the remaining stages are coupled to respective data inputs 9 of a multiplexer 10 which has single output 11 and, in the present case, fourteen data inputs. The output 11 is coupled to the other input of the inverting EX-OR gate 7. The bit lines of the, in the present example four-bit, select signal input 12 of multiplexer 10 are fed from respective bit lines of the data bus 13 of the computer 14 via a latch 15. In the present case data bus 13 comprises twelve bit-lines. The hold or latch signal input 16 of latch 15 is fed from a further output 17 of computer 14.

The output of the EX-OR gate 7 is fed to the up-/down control input 18 of an up/down counter 19 the twelve bit data input 20 of which is connected to the data bus 13 and the load signal input 21 of which is fed from another output 22 of computer 14. The clock signal input 37 of counter 19 is fed from an output 38 of a logic circuit 29. The data output 23 of counter 19 is connected to the data input 24 of an (in the present case twelve-bit-wide) tristate buffer 25 the data output 26 of which is connected to the data bus 13. The hold signal input 27 of buffer 25 is fed from an output 28 of the logic circuit 29. Inputs 32, 33, 34 and 340 of logic circuit 29 are fed from the output 22 and further outputs 35, 36 and 360 respectively of computer 14.

A further output 39 of logic circuit 29 is connected to one input 40 of a random access memory 41 each location in which is capable of storing a twelve-bit word. The address input/data output 42 of RAM 41 is connected to the data bus 13 and a further input 45 of RAM 41 is fed from the output 17 of the computer 14.

A further output 43 of computer 14 is connected to an output terminal 44.

The apparatus of FIG. 2 effectively forms an autocorrelogram of a signal applied to the input 1 as follows. The input signal is filtered in bandpass filter 4 (which may have a passband extending, for example, from 150 Hz to 2 kHz), hard-limited in comparator 5, and the result (in the form of a succession of binary "0s" and "1s") applied to the data input 2 of shift register 3. In this "autocorrelogram compute" mode computer 14 applies shift pulses to the input 30 of register 3 at a rate of, for example, 9.5 kHz and, in the interval between each such shift pulse and the next, it causes each of fourteen different select signals to be applied to the select signal input 12 of multiplexer 10 in turn via latch 15. Thus samples of the hard-limited input signal at the input 2 of shift register 3 are entered into, and clocked through, shift register 3 at a rate of 9.5 kHz and, when each of these samples is present at the output 6 of the first stage of register 3, and hence is being applied to one input of EX-OR gate 7, the oldest fourteen of the preceeding fifteen samples appear in turn at the outlet 11 of multiplexer 10 and are applied to the other input of EX-OR gate 7. EX-OR gate 7 effectively multiplies the samples corresponding to each pair of its input signals together and applies the result to the up/down input 18 of counter 19.

Each time a new select signal for multiplexer 10 is latched into latch 15 it is also applied, via data bus 13, as an address signal to the input/output 42 of RAM 41. Each time this occurs the content of the corresponding location in RAM 41 is read on to the data bus and loaded into counter 19, is incremented or decremented in accordance with the current output of gate 7, and the result written back, via tristate buffer 25, into the same location in RAM 41.

The above cycle of operations is repeated, for example, five hundred times, each cycle starting with the loading of a new input signal sample into shift register 3. The result is that an autocorrelogram (c.f. FIG. 1) of the filtered and hard-limited input signal becomes stored in the relevant fourteen locations in RAM 41. If reference is made to equation (1) above it will be seen that, with the various parameters quoted, T is approximately 0.053 seconds and $\tau$ extends from 0.00021 seconds to 0.00158 seconds in intervals of 0.000105 seconds. The factor 1/T in equation (1) is not taken into account because it is irrelevant for the purposes of the present apparatus. Moreover, values of the autocorrelation function are not calculated for very low and zero values of $\tau$ in order to obtain some discrimination against noise (c.f. FIGS. 1(a) and 1(d)).

The computer 14 is programmed to cause the above operations to be carried out, to then process the results in a manner which will be described below, to then repeat the said operations to produce a new autocorrelogram, and so on.

Figure 3:
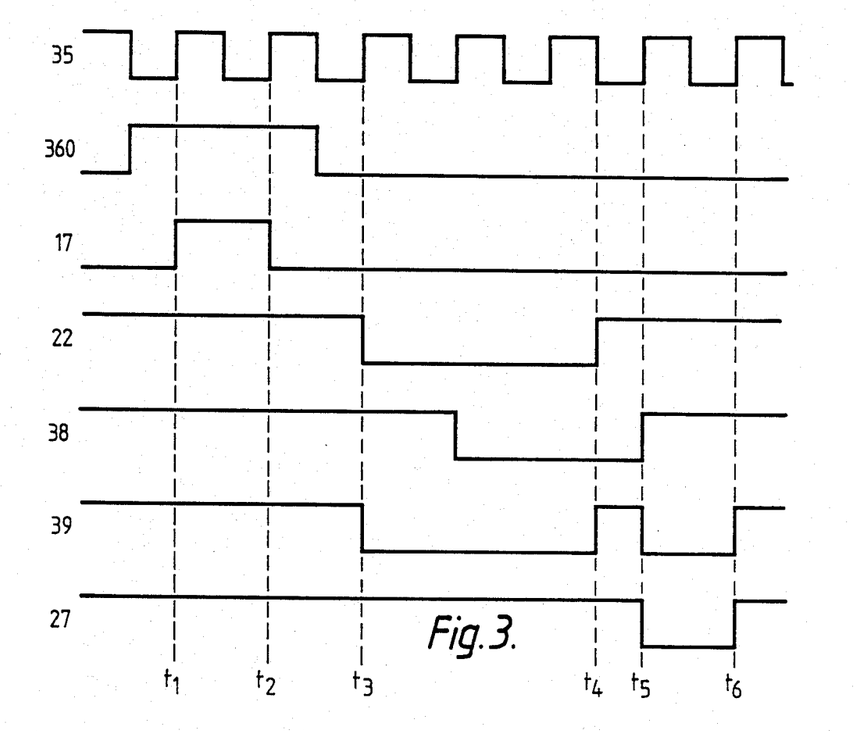
FIG. 3 shows some signals occurring in the embodiment of FIG. 2.

A timing diagram for each of the read/write operations in RAM 41 set forth above is shown in FIG. 3, each signal being assigned the same reference numeral as is the corresponding output in FIG. 2. The signal 35 is the internal clock signal of the microcomputer 14 and the signals 360, 17 and 22 are normally produced by the microcomputer 14 in the course of a normal memory read operation. (Signal 360, when logic "1", indicates generally that data is being put on to the bus 13 by the computer 14. If the microcomputer 14 uses, for example, the Intersil 6100 microprocessor, this signal corresponds to the signal referred to as XTB in the microprocessor manufacturer's literature.) At time $t_1$ the computer 14 puts the requisite address for RAM 41 onto the bus 13 and at time $t_2$ this address is latched into latch 15 and RAM 41. At time $t_3$ RAM 41 applies the data stored in the addressed location to the data bus and at time $t_4$ this data is entered into counter 19. At time $t_5$ counter 19 is incremented or decremented in accordance with the current output of gate 7 and the result is latched into tristate buffer 25, and at time $t_6$ the content of buffer 25 is stored in the same location in RAM 41. RAM 41 (which in practice will normally form part of computer 14 and also be used for other purposes) is constructed to react to the occurrence of a second binary "0" at its input 40 within one clock period of the termination of a first such binary "0" by storing data present at its input-/output 42 at the same location that was read in response to the first binary "0".

Figure 4:
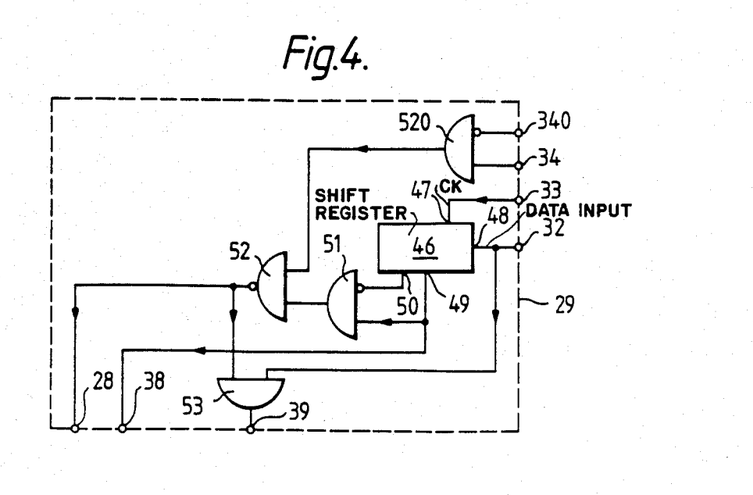
FIG. 4 is the circuit diagram of a possible construction for part of the embodiment of FIG. 2.

A possible construction for the logic circuit 29 of FIG. 2 is shown in FIG. 4. It comprises a shift register 46 to the clock input 47 of which the input 33 is connected and to the data input 48 of which the input 32 is connected. The outputs 49 and 50 of the first and second stages of register 46 are connected to non-inverting and inverting inputs respectively of an AND gate 51. The output of gate 51 is connected to one input of a NAND gate 52 the other input of which is fed from the input 34 via an AND gate 520. The other input of gate 520, which input is inverting, is fed from the input 340. The output of gate 52 feeds output 28 and also one input of an AND gate 53 the other input of which is fed from input 32. Outputs 38 and 39 are fed from the outputs of the first stage of shift register 46 and gate 53 respectively. In the "autocorrelogram compute" mode the computer 14 of FIG. 2 applies a logic 1 to input 34, thereby causing, inter alia, the second "low" in the signal 39 of FIG. 3 to be generated in the course of a memory "read" operation and hence the read operation to be immediately followed by a write operation at the same location.

Figure 5:
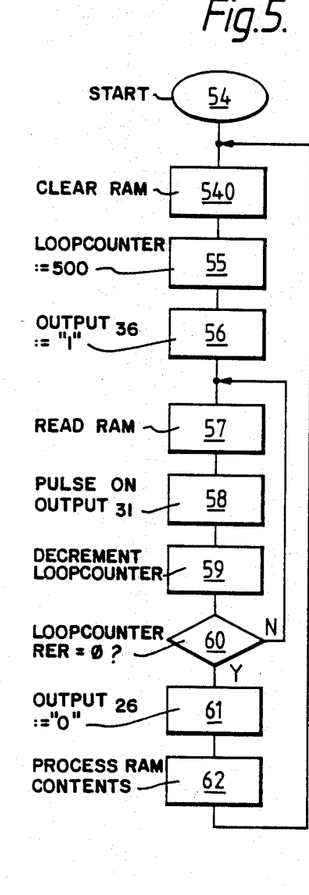
FIG. 5 is a flow chart of some operations carried out in the embodiment of FIG. 2.

FIG. 5 is a flow chart indicating how the computer 14 is programmed to cause the operations described above to be carried out. The various steps shown in FIG. 5 have the following significances:

54—Start

540—Clear the fourteen locations in RAM 41 referred to in the description of FIG. 2.
55—Set loop counter to 500
56—Set output 36 to binary "1"
57—"Read" the fourteen locations in RAM 41 referred to in the description of FIG. 2 in succession.
58—Generate pulse on output 31.
59—Decrement loop counter.
60—Loop counter=0?
61—Set output 36 to binary 0
62—Process contents of the fourteen locations in RAM 41 "read" in step 57.

The processing operation signified by block 62 in FIG. 5 may perform several functions but it in any case includes the detection of the presence of peaks (positive or negative) in the autocorrelogram just calculated and, by referring to and comparison with the results obtained for autocorrelograms previously calculated, a determination of whether peaks (if any) so detected are stationary or wandering with respect to the delay axes (c.f. the $\tau$-axes in FIG. 1) of these autocorrelograms as these autocorrelograms relate to successive periods of time. (The interval between each of these periods of time and the next is equal to the time taken to complete the major loop shown in FIG. 5).

Figure 6:
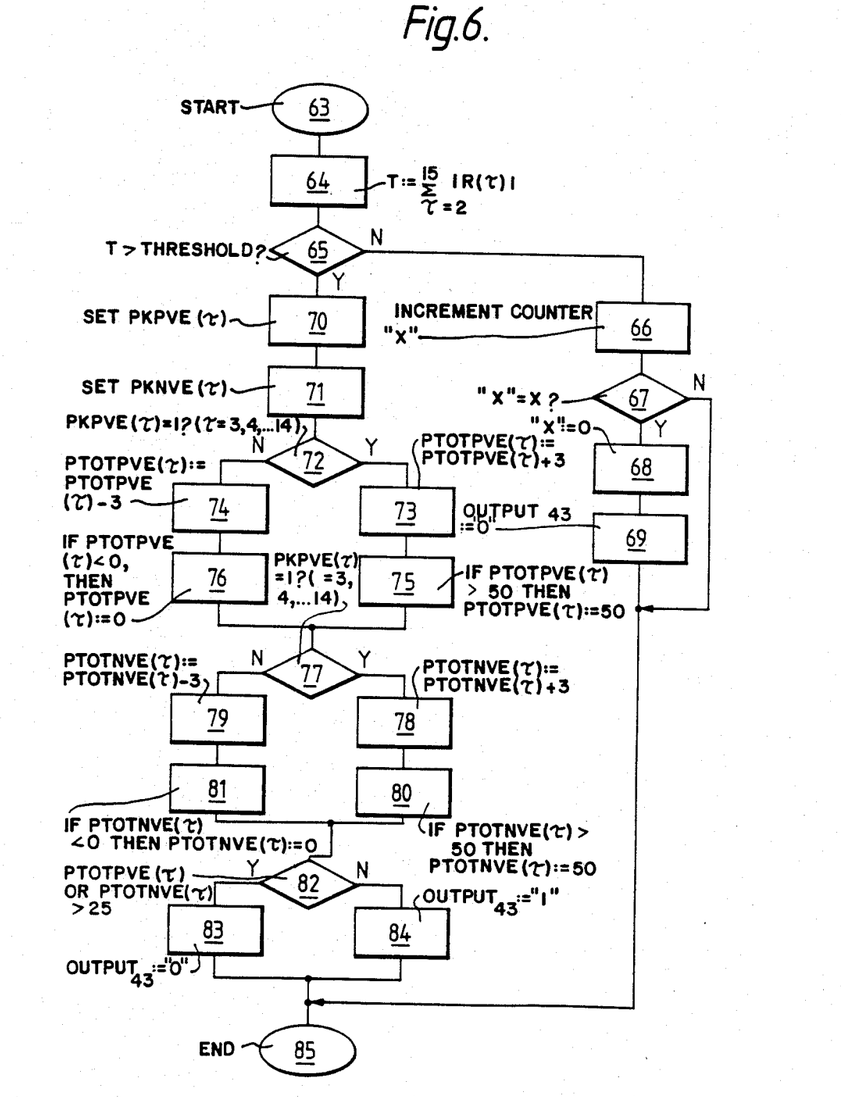
FIG. 6 is a detailed version of part of the flow chart of FIG. 5.

One way in which this part of step 62 in FIG. 5 can be done will now be described with reference to the flow-chart of FIG. 6. In this method it is first determined (steps 63–65) whether a non-noise signal was actually present at the input 1 of FIG. 2 during the period to which the autocorrelogram last formed relates. If such a signal was not present the program proceeds via steps 66 and 67, and possibly steps 68 and 69, substantially immediately to the end of step 62 in FIG. 5 and hence to the formation of a new autocorrelogram. If the absence of a non-noise signal has persisted for, for example, one second (corresponding to the time taken by a given number, X say, of successive traversals of the major loop shown in FIG. 5) the computer 14 sets its output 43, and hence output terminal 44, to binary "0" (step 69), signalling that a speech signal is not present. If on the other hand it is determined that a non-noise signal was present at input 1 the positions, along the delay axis, of the peaks in the autocorrelogram last formed are determined (steps 70, 71) and compared (steps 72–82) with the positions correspondingly determined for the peaks in the preceding autocorrelograms. If the comparison reveals that the positions are persisting, i.e. that there is a significant correlation with the positions of the peaks determined for the immediately preceding autocorrelograms, for example those corresponding to the period of one second just elapsed, computer output 43 and hence output terminal 44 is set to binary "0" (step 83), again signalling that the signal at input terminal 1 is not a speech signal. If conversely, the comparison reveals that there is no significant correlation with the positions of the peaks determined for the immediately preceding autocorrelograms and, moreover, this state of affairs has persisted for, for example, one second, the computer 14 sets output 43 and hence output terminal 44 to binary "1", (step 84) to indicate that the signal at input 1 is probably a speech signal.

If the values of the autocorrelation function stored in RAM 41 are R(2), R(3), ... R(15) respectively, these corresponding in succession to steadily increasing values of $\tau$ (c.f. FIG. 1) the determination of whether a non-noise signal is present is done simply by summing the moduli of these values, i.e. by forming the $$\text{sum } T = \sum_{\tau=2}^{15} |R(\tau)|,$$

and determining whether T is greater than a predetermined threshold (chosen empirically). If T is greater than the threshold this is taken to indicate that a non-noise signal is present. (It will be noted from FIG. 1(a) that the contribution of noise to an autocorrelogram lies substantially exclusively at zero and very small values of $\tau$, which values are not taken into account when calculating the quantities $R(\tau)$ in RAM 41. Moreover, because the input signal is hard-limited in the apparatus of FIG. 2, $R(\tau)$ is always unity at $\tau=0$ and, for a noise signal, drops sharply from this value as $\tau$ takes on increasing positive values.

The positions, along the delay axis, of the positive peaks in the autocorrelogram just formed are determined by testing whether, for each of $\tau=3, 4, \ldots 14$, $R(\tau-1) \leq R(\tau) > R(\tau+1)$. If this inequality if satisfied for a particular value of $\tau$ then a corresponding bit Pkpve ($\tau$) of a twelve-bit array Pkpve(3), Pkpve(4), ... Pkpve(14) is set to "1"; otherwise it is set to "0". Similarly the positions, along the delay axis, of the negative peaks in the autocorrelogram just formed are determined by testing whether, for each of $\tau=3, 4, \ldots 14$, $R(\tau-1) \geq R(\tau) < R(\tau+1)$. If this inequality is satisfied for a particular value of $\tau$ then a corresponding bit Pknve($\tau$) of a second twelve-bit array Pknve(3), Pknve(4), ... Pknve(14) is set to "1". Otherwise it is set to zero.

The determination of whether the peaks just located are stationary or wandering with respect to the delay axis of the autocorrelogram is carried out by forming twenty-four running variables Ptotpve(3), Ptotpve(4), ... Ptotpve(14) and Ptotnve(3), Ptotnve(4) ... Ptotnve(14), where each of these has imposed on it maximum and minimum limit values of 50 and zero respectively. If a positive peak occurs in the autocorrelogram just formed at a given delay $\tau$, i.e. if Pkpve($\tau$)=1, then 3 is added to the current value of the corresponding variable Ptotpve($\tau$). Conversely, if a positive peak does not occur in the autocorrelogram just formed at a given delay $\tau$, i.e. if Pkpve($\tau$)=0, then 3 is subtracted from the current value of the corresponding variable Ptotpve($\tau$). Similarly, if a negative peak occurs in the autocorrelogram just formed at a given delay $\tau$, i.e. if Pknve($\tau$)=1, then 3 is added to the current value of the corresponding variable Ptotnve($\tau$). Conversely, if a negative peak does not occur in the autocorrelogram just formed at a given delay $\tau$, i.e. if Pknve($\tau$)= 0, then 3 is subtracted from the current value of the corresponding variable Ptotnve($\tau$). When all the variables Ptotpve and Ptotnve have been treated in this way a test is made as to whether any of them is greater than 25. If it is then computer 14 sets its output 43, and hence output terminal 44, to binary "0" to indicate the presence of a non-speech signal at input terminal 1. Conversely, if none of the variables is found to be greater than 25, computer 14 sets its output 43 to binary "1" to indicate the probable presence of a speech signal at input terminal 1.

The various steps shown in FIG. 6, which is in effect a possible detailed configuration for block 62 in FIG. 5, are as follows:
63—Start 64— Calculate $T = \sum_{\tau=2}^{15} |R(\tau)|$ 65—T>threshold?
66—Increment counter "x"
67—Counter "x"=X?
68—Set counter "x" to 0
69—Set output 43 to "0"
70—For each of $\tau=3, 4, \ldots 14$, if $R(\tau-1) \leq R(\tau) > R(\tau+1)$ set Pkpve($\tau$) to 1. Otherwise set Pkpve($\tau$) to 0.
71—For each of $\tau=3, 4, \ldots 14$, if $R(\tau-1) \geq R(\tau) < R(\tau+1)$ set Pknve($\tau$) to 1. Otherwise set Pknve($\tau$) to 0.
72—For each of $\tau=3, 4, \ldots 14$, is Pkpve($\tau$)=1?
73—Corresponding variables(s) Ptotpve($\tau$): =Ptotpve($\tau$)+3
74—Corresponding variable(s) Ptotpve($\tau$): =Ptotpve($\tau$)−3
75—Set any Ptotpve($\tau$) which is greater than 50 equal to 50.
76—Set any Ptotpve($\tau$) which is less than 0 equal to 0.
77—For each of $\tau=3, 4, \ldots 14$, is Pknve($\tau$)=1?
78—Corresponding variable(s) Ptotnve($\tau$): =Ptotnve($\tau$)+3
79—Corresponding variable(s) Ptotnve($\tau$): =Ptotnve($\tau$)−3
80—Set any Ptotnve($\tau$) which is greater than 50 equal to 50
81—Set any Ptotnve($\tau$) which is less than 0 equal to 0.
82—Is any Ptotpve($\tau$) or Ptotnve($\tau$)>25?
83—Set output 43 to "0".
84—Set output 43 to "1".
85—End.

It will be appreciated that the various parameters chosen above, for example the choice of 3 as the value which is added to or subtracted from Ptotpve and Ptotnve, the choice of limit values of 0 and 50 for Ptotpve and Ptotnve, and the criterion of any Ptotpve or Ptotnve being greater than 25 as indicating a non-speech signal are only exmples of those possible and many alternatives can be used. Obviously the values chosen in a particular context will depend inter alia on the time taken to traverse the major loop shown in FIG. 5 (which in the embodiment described was of the order of 100 mS) and on the actual assumptions made about the general characteristics of speech and the signals from which speech is to be distinguished. Thus, for example, in the embodiment described it was assumed that a long vowel sound (which might give rise to what in the short term appears to be a stationary peak or trough) will not last for more than 0.5 S. It should be mentioned that the embodiment described was found to be liable to treat music signals in the same way as it treats speech, i.e. to produce a binary "1" at output 44 when the signal at input 1 was in fact music.

It will be appreciated that the embodiment so far described may treat an input signal consisting of a mixture of speech and tone signals, if the tone signal is of comparable or greater amplitude, as if it is not a speech signal, with the consequence that, if it is used to provide "non-speech squelch" in a communications receiver, such input signal mixtures will be rejected. Provided that the amplitude of the tone signal component is not very much larger than that of the speech signal (which would result in the speech signal being totally absent from the output of the comparator 5 of FIG. 2) this possible disadvantage can be overcome by providing additional processing steps in the block 62 of FIG. 5, these occurring before the steps described with reference to FIG. 6 are carried out and effectively performing the function of an adaptive tone filter by suitably modifying the various values of the autocorrelation function calculated in steps 57-60 of FIG. 5.

Figure 7:
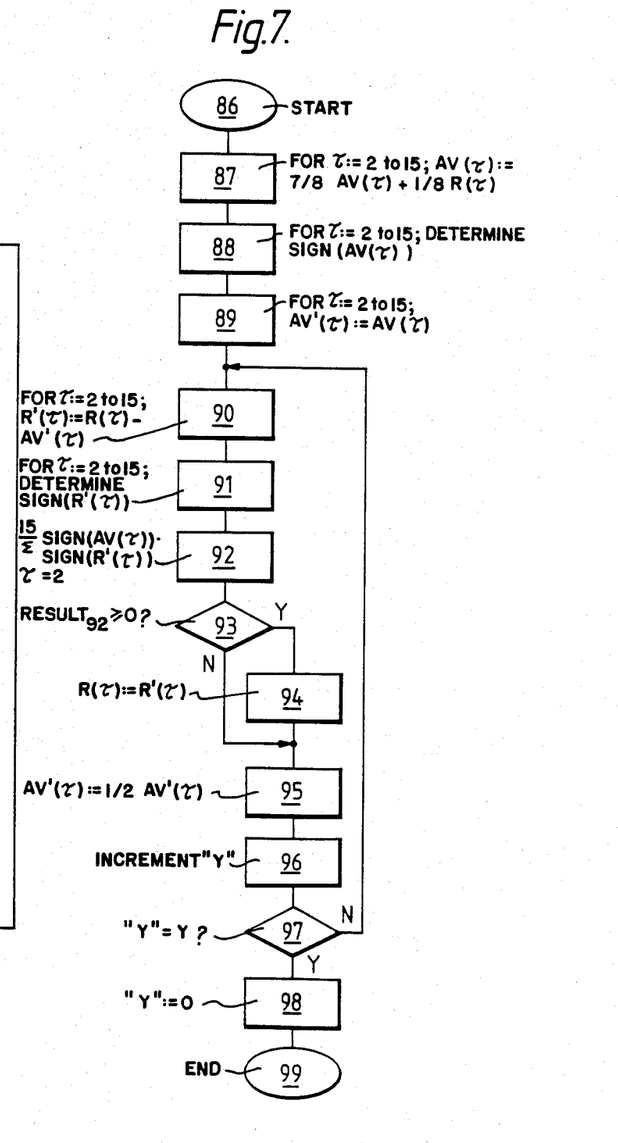
FIG. 7 is a flow chart showing additional processing steps which can be added to the steps shown in the flow charts of FIGS. 5 and 6.

These additional processing steps may be as shown in the flow chart of FIG. 7 and perform the following operations. First of all (step 87) a running average (AV($\tau$)) ($\tau=2$ to 15) which is kept of each of the values R(2), R(3), ... R(15) of the autocorrelation function stored in the function locations in RAM 41 as they relate to successive autocorrelograms is updated in accordance with the current values stored in RAM 41. Moreover, the signs Sign AV($\tau$) of each of the newly updated running averages are determined and stored (step 88) and, in addition, fourteen variables AV'($\tau$) ($\tau=2$ to 15) are set equal to the corresponding updated running averages AV($\tau$) (step 89). A modified value R'($\tau$) of each of the currently stored values R($\tau$) is then calculated (step 90) by subtracting the corresponding variable AV'($\tau$) from each and the signs Sign R'($\tau$) of the modified values R'($\tau$) are also calculated and stored (step 91). It is then determined (step 92, 93) if there is a positive or zero correlation between the modified values R'($\tau$) and the corresponding running average values AV($\tau$). This is done by calculating $$\sum_{\tau=2}^{15} \text{Sign } R'(\tau) \text{ Sign } AV(\tau)$$

and determining if the result is greater than or equal to 0. If it is, the modified values R'($\tau$) are substituted for the stored values R($\tau$) (step 94), and each of the variables AV'($\tau$) is replaced by half its previous value, after which the program returns to step 90 via steps 96 and 97 (which merely act as a loop counter). If on the other hand it is found in step 93 that the sum calculated in step 92 is less than zero (i.e. that there is a negative correlation and hence that too much has been subtracted in step 90) the operations are the same except that step 94 is omitted. The loop containing steps 90-97 is repeated several, for example Y=9, times so that the originally calculated values R($\tau$) become modified by a process of successive approximations (a given multiple or fraction K of the corresponding average AV($\tau$) is subtracted from each in such manner that there is no longer any significant correlation betweem them and the running averages AV($\tau$). This in effect means that the contribution to the autocorrelogram of any tone signal which may be present at input 1 in FIG. 2 has been reduced.

The various blocks shown in FIG. 7 have the following significances:
86—Start
87—For $\tau=2$ to 15 $AV(\tau)$: $=\tfrac{7}{8}AV(\tau)+\tfrac{1}{8}R(\tau)$
88—For $\tau=2$ to 15 determine Sign AV($\tau$)
89—For $\tau=2$ to 15 $AV'(\tau)$: $=AV(\tau)$
90—For $\tau=2$ to 15 calculate $R'(\tau)=R(\tau)-AV'(\tau)$
91—For $\tau=2$ to 15 determine Sign R'($\tau$)

92— Calculate $\sum_{\tau=2}^{15} \text{Sign } AV(\tau) \cdot \text{Sign } R'(\tau)$ 93—Result of step 92≧0?
94—R(τ): =R'(τ)
95—AV'(τ): =½AV'(τ)
96—Increment counter "y"
97—Counter "y"=Y?
98—Reset counter "y" to 0
99—End.

As mentioned previously, when the input signal is hard-limited, as it is in comparator 5 in FIG. 2, the steps described above only enable the apparatus to respond in the desired manner to a mixture of speech and tone signals at input 1 if the amplitude of the tone signal is not very much greater than that of the speech signal, because otherwise the speech signal will not contribute at all to the output of comparator 5. This disadvantage can, of course, be overcome by removing the hard-limiter, quantizing the input signal instead to more than two levels. However it will be appreciated that this will necessitate the provision of considerable amounts of extra circuitry and processing, e.g. the replacement of register 3 by a multibit shift register, EX-OR gate 7 by a multibit binary multiplier, counter 19 by a multibit binary adder, etc., etc., and it may be considered that these disadvantages outweigh the advantages obtained.

Although the apparatus described forms a succession of autocorrelograms relating to successive periods of time completely independently one from the other it will be appreciated that this is not essential. As an alternative each new autocorrelogram can be obtained from the preceding one by a process of updating, provided that the contribution of each autocorrelogram to the succeeding ones is arranged to decay as the succeeding ones relate to periods of time which lie further and further in the future. In effect this means that the said successive periods of time will in such a case partly overlap one another. One way in which this can be done is illustrated by the apparatus shown in FIG. 8, which could replace the autocorrelogram forming portion of the apparatus described with reference to FIGS. 2-7. Certain components shown in FIG. 8 have counterparts in FIG. 2. Where this is the case they have been given the same reference numerals.

Figure 8:
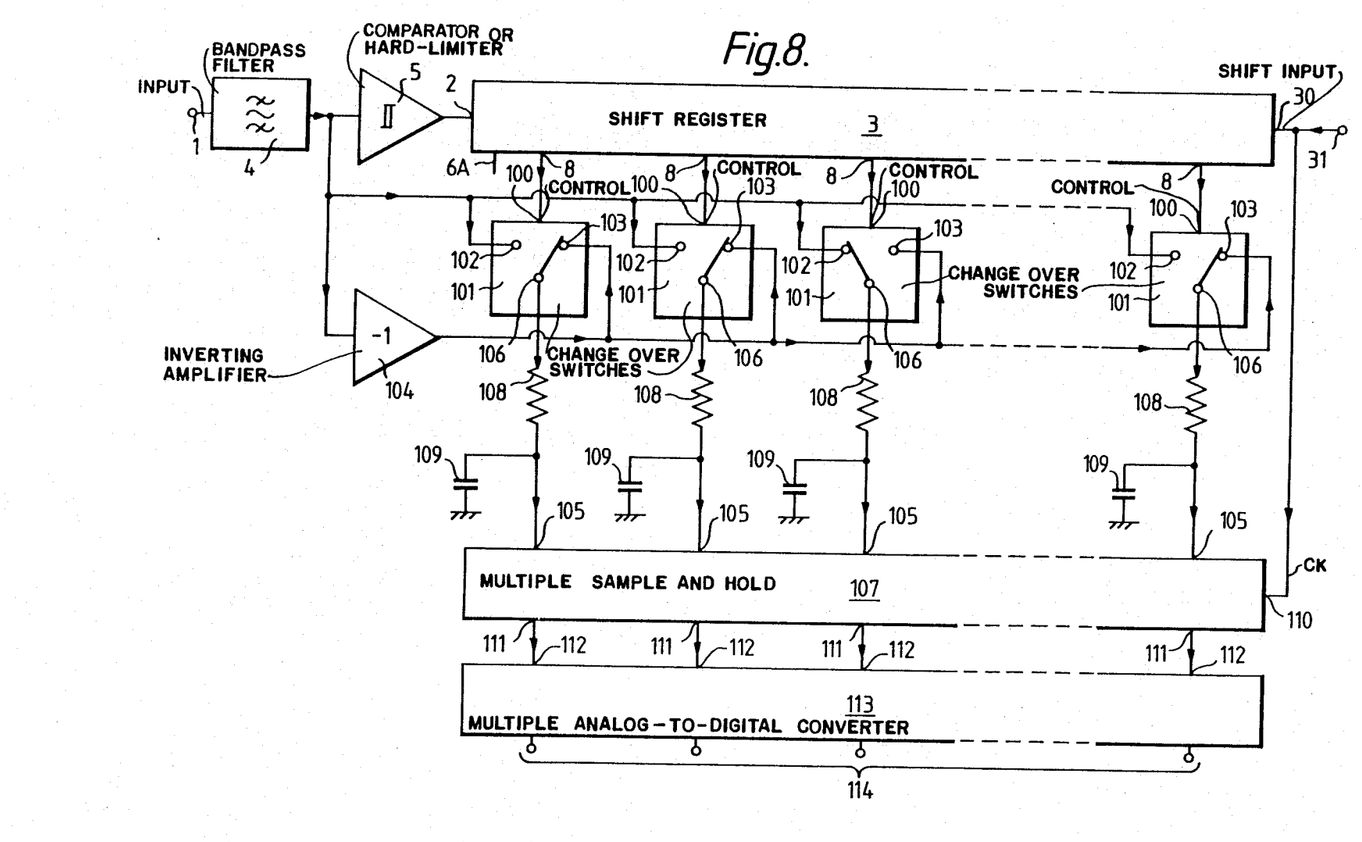
FIG. 8 shows a possible alternative to part of the embodiment of FIG. 2.

In FIG. 8 the input terminal 1 is again coupled to the input 2 of shift register 3 via a bandpass filter 4 and a comparator or hard-limiter 5. However, now the various bit-lines constituting the output 8 of shift-register 3 are coupled to the control inputs 100 of respective electronic changeover switches 101 one changeover terminal 102 of each of which is fed from the output of filter 4 directly and the other changeover terminal 103 of each of which is fed from the output of filter 4 via an inverting amplifier 104. The poles 106 of the switches 101 are connected to respective inputs 105 of a multiple sample-and-hold circuit 107 via respective RC integrator circuits each comprising a series resistor 108 and a parallel capacitor 109. The clock input 110 of sample-and-hold circuit 107 is fed from the output 31 of computer 14 (FIG. 2) as is the shift input 30 of register 3. The outputs 111 of the various individual sample-and-hold circuits in circuit 107 are connected to respective inputs 112 of a multiple analog-to-digital converter 113 which has corresponding (multiple bit-line) outputs 114.

If the input signal at input terminal 1 is v(t) it will be seen that, at any given time, the outputs 8 of shift register 3 carry hard-limited signals v(t−τ), i.e signals Sign v(t−τ) where τ=2τ', 3τ',... respectively, τ' being the delay occurring between each stage of register 3 and the next. If a given Sign v(t−τ) is positive the corresponding changeover switch 101 is controlled to connect its changeover terminal 102 to its pole 106. Conversely, if a given Sign v(t−τ) is negative the corresponding switch 101 is controlled to connect its changeover terminal 103 to its pole 101. Thus the RC circuits 108, 109 are fed with the quantities Sign v(t−τ)·v(t) where τ for a given RC circuit is that corresponding to the corresponding output of register 3. The RC-circuits integrate these signals over a limited period (determined by the RC time-constant) and apply them to the sample-and-hold circuit 113. Thus the various signals at the outputs 114 of circuit 113 can be expressed by $$R(\tau) = \int_0^T v(t) \cdot \text{Sign } v(t-\tau) \cdot W(t) \cdot dt$$

where τ for a given signal corresponds to the delay produced by shift-register 3 at the corresponding output 8 and $W(t) = \exp(-t/CR)$. The time constant CR may be of the order of 0.05 S for each RC circuit. Thus, in operation the outputs 114 carry signals R(τ) corresponding to those contained in the aforesaid fourteen locations in RAM 41 in FIG. 2 after the formation of each autocorrelogram, and can be processed in the same way, e.g. in the manner described with reference to FIGS. 6 and 7.

In the embodiments described the determination of whether the peaks in the successive autocorrelograms are stationary or wandering is carried out by determining whether they are stationary, an assumption being made that, if a non-noise signal is present at input terminal 1 and no stationary peaks are present, then wandering peaks must be present. As an alternative, or in addition, a positive determination can be made as to whether moving peaks are present. This may be done, for example, by as before keeping an account, which decays with a given time constant, of the positions of the peaks along the delay axis in the successive autocorrelograms and updating this account in accordance with the data obtained for each new autocorrelogram. However now, instead of setting output 43 to binary "0" if persistent peaks are found, a test can be made as to whether the respective peaks in the current autocorrelogram lie at points along the delay axis of the autocorrelogram which are immediately adjacent points at which the account reveals that peaks have recently occurred and, if at least a given number of them do, setting output 43 to binary "1" to indicate the probable presence of a speech signal at input terminal 1. (This assumes that the positions of the peaks arising from a speech signal will not wander by more than one point along the delay axis from each autocorrelogram to the next). Obviously refinements to this technique are possible. For example a statistical analysis may be carried out on the changes or otherwise in the peak positions and output 43 be only set to binary "1" if the analysis reveals that the majority of peaks are wandering.

The arrangements described may form part of a non-speech signal operated squelch system in a communications receiver, for example a receiver for single-sideband signals in the HF band. To this end the input terminal 1 of FIG. 2 may be fed from the output of the receiver demodulator and the output terminal 44 be connected to a disable signal control input of the audio channel of the receiver.

What is claimed is:

1. Apparatus for distinguishing between speech and non-speech signals present in an input signal, comprising
   (a) an input for receiving said input signal;
   (b) means for forming, for each of successive time intervals of said input signals, a respective autocorrelogram signal from said input signal, each autocorrelogram signal extending over a range of delays having lower and upper limits;
   (c) means for detecting the presence and delay, within respective autocorrelogram signals of peak values;
   (d) means for comparing the delay, of said peak values in said autocorrelogram signals to determine whether the delays of said peak values are the same over successive autocorrelogram signals; and
   (e) an output for indicating that the input signal contains speech when said delays of said peak values are not the same.

2. Apparatus for distinguishing between speech and non-speech signals present in an input signal, comprising
   (a) means for receiving said input signal;
   (b) means for forming an autocorrelogram signal, for a time interval of said input signal, from said input signal, said means for forming having at least one control input, said autocorrelogram signal extending over a range of delays having lower and upper limits;
   (c) means for storing autocorrelogram signals, coupled to said forming means; and
   (d) control means comprising:
      (i) means for transmitting control signals to control said forming means and said storing means so as to cause formation and storage of a plurality of successive autocorrelogram signals;
      (ii) means for detecting the presence and delay within respective autocorrelogram signals of peak values;
      (iii) means for comparing the delays of said peak values in said autocorrelogram signals to determine whether the delays of said peak values are the same over successive autocorrelogram signals;
   (e) an output for indicating that the input signal contains speech when said delays of said peak values are not the same.

3. The apparatus of claim 1 or 2 wherein:
   (a) said input signal has two components representing input signal point values, said components assuming successive values over time; and
   (b) said means for forming quantizes to two levels the successive values of at least one of the two components of the input signal points and calculates a value of a corresponding two component autocorrelogram signal point from the result.

4. The apparatus of claim 3 wherein:
said means for forming quantizes to two levels the successive values of both of the two components of the input signal and calculates the value of the corresponding two component autocorrelation signal point from the result.

5. The apparatus of claim 1 or 2, wherein:
   (a) said means for forming calculates said autocorrelogram signal as a plurality of discrete points, said discrete points beginning at a respective predetermined delay after the lower limit of the range of delays;

(b) said means for detecting comprises:
      (i) means for summing the absolute values of said autocorrelogram signals; and
      (ii) means for comparing a result produced by the means for summing with a predetermined threshold.

6. The apparatus of claim 5 wherein:
   (a) said discrete points correspond, for each autocorrelogram signal, to a same plurality of delay values within said respective range of delays;
   the apparatus further comprising:
   (b) a plurality of means for running storage of pairs of values, each respective pair corresponding to one of said delay values, a first value of each respective pair indicating whether its corresponding delay value corresponds to a positive peak value of said autocorrelogram signals, a second value of each respective pair indicating whether its corresponding delay values corresponds to a negative peak value of said autocorrelogram signals;
   (c) means for determining whether a peak value of one of said autocorrelogram signals is positive or negative;
   (d) means for incrementing respective first values of said means for running storage when corresponding delay values correspond to positive peak values of said autocorrelogram signals;
   (e) means for incrementing respective second values of said means for running storage when corresponding delay values correspond to positive peak values of said autocorrelogram signals;
   (f) means for decrementing both respective first and second values of said means for running storage, when corresponding delay values do not correspond to peak values of said autocorrelogram signals;
   (g) means for imposing maximum and minimum values on each means for running storage, so that any value, in said means for running storage, which is greater than a predetermined amount indicates that the delay of the corresponding peak has remained the same over successive autocorrelogram signals.

7. The apparatus of claim 1 or 2 comprising
a band-pass filter coupled to the input and having an output coupled to said means for forming.

8. Apparatus of claim 1 or 2 wherein said means for forming comprises
   (a) means for maintaining a running average of said autocorrelogram signals;
   (b) means for generating a modified autocorrelogram signal which is a difference between a current autocorrelogram signal and said running average, calculating said difference including adjusting relative amplitudes of said current autocorrelogram signal and said running average so that there is substantially zero correlation between said difference and said running average said modified autocorrelogram signal being provided as the autocorrelogram signal outputted from said means for forming.

9. A communication receiver comprising a squelch circuit for distinguishing between speech and non-speech signals present in an input signal, said squelch circuit comprising:
   (i) an input for receiving said input signal;
   (ii) means for:
      (a) forming, for each of successive time intervals of said input signal, a respective autocorrelogram signal from a signal received at said input, each autocorrelogram signal extending over a range of delays having lower and upper limits, (b) detecting the presence of peak values in said autocorrelogram signals, and (c) determining whether the delays of said peak values within the respective autocorrelogram signals are the same over the successive autocorrelogram signals; and (iii) an output indicating that the signal received at the input contains speech, when the delays of said peak values are not the same.

10. The apparatus of claim 9 wherein:

(i) said input signal has two components representing input signal point values, said components assuming successive values over time; and (ii) said means comprises, for the formation of each autocorrelogram signal, means for quantizing to two levels the successive values of at least one of the two components of the input signal points and means for calculating a value of a corresponding two component autocorrelogram signal point from the result.

11. The apparatus of claim 10 wherein:

(i) said means for quantizing quantizes to two levels the successive values of both of the two components of the input signal; and (ii) said means for calculating calculates the value of the corresponding two component autocorrelation signal point from the result.

12. The apparatus of claim 9, wherein (i) said means, for the formation of said autocorrelogram signal, calculates said autocorrelogram signal as a plurality of discrete points, said discrete points beginning at a respective predetermined delay interval after the lower limit of the range of delays;

(ii) said means, for the detection of said peak values, comprises:

(A) means for summing the absolute values of said autocorrelogram signals; and (B) means for comparing a result produced by the means for summing with a predetermined threshold.

13. The apparatus of claim 12 wherein:

(i) said discrete points correspond, for each autocorrelogram signal, to a same plurality of delay values within said respective range of delays; and the means further comprises:

(ii) plurality of means for running storage of pairs of values, each respective pair corresponding to one of said delay values, a first value of each respective pair indicating whether its corresponding delay value corresponds to a positive peak value of said autocorrelogram signals, a second value of each respective pair indicating whether its corresponding delay value corresponds to a negative peak value of said autocorrelogram signals;

(iii) means for determining whether a peak value of said autocorrelogram signals is positive or negative;

(iv) means for incrementing respective first values of said means for running storage when corresponding delay values correspond to positive peak values of said autocorrelogram signals;

(v) means for incrementing respective second values of said means for running storage when corresponding delay values correspond to positive peak values of said autocorrelogram signals;

(vi) means for decrementing both respective first and second values of said means for running storage, when corresponding delay values do not correspond to peak values of said autocorrelogram signals; and (vii) means for imposing maximum and minimum values on each means for running storage, so that a value, in said means for running storage, which is greater than a predetermined amount indicates that the delay of the corresponding peak has remained the same over successive autocorrelogram signals.

14. The apparatus of claim 9 comprising a band-pass filter coupled to the input and having an output coupled to said means.

15. Apparatus of claim 9 wherein said means for the formation of said autocorrelogram signal:

(A) maintains a running average of said autocorrelogram signals;

(B) generates a modified autocorrelogram signal which is a difference between a current autocorrelogram signal and said running average, calculating said difference including adjusting relative amplitudes of said current autocorrelogram signal and said running average so that there is substantially zero correlation between said difference and said running average said modified autocorrelogram signal being provided as the autocorrelogram signal outputted from said means for forming.

16. Method of distinguishing between speech and non-speech signals present in an input signal, comprising:

(i) receiving said input signal;

(ii) forming, for each of successive time intervals of said input signal, a respective autocorrelogram signal from said input signal, said each autocorrelogram signal extending over a range of delays having lower and upper limits;

(iii) detecting the presence and delay within respective autocorrelogram signals of peak values;

(iv) determining whether the delays of said peak values of said autocorrelogram signals are the same over successive autocorrelogram signals; and (v) indicating that the input signal contains speech, when the delays of said peak values are not the same.

* * * * *